United States Patent
Tseng et al.

(10) Patent No.: US 9,524,361 B2
(45) Date of Patent: Dec. 20, 2016

(54) METHOD FOR DECOMPOSING A LAYOUT OF AN INTEGRATED CIRCUIT

(71) Applicant: UNITED MICROELECTRONICS CORP., Hsin-Chu (TW)

(72) Inventors: Ting-Cheng Tseng, Tainan (TW); Ming-Jui Chen, Hsinchu (TW); Chia-Wei Huang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 25 days.

(21) Appl. No.: 14/690,491

(22) Filed: Apr. 20, 2015

(65) Prior Publication Data

US 2016/0306910 A1 Oct. 20, 2016

(51) Int. Cl.
*G06F 17/50* (2006.01)

(52) U.S. Cl.
CPC ................. *G06F 17/5068* (2013.01)

(58) Field of Classification Search
CPC .. G06F 17/5081; G06F 17/5068; G06F 17/50; G06F 17/5077; G06F 2217/12; G06F 2217/62; G03F 1/00; G03F 7/70466; G03F 1/144; G03F 1/30; G03F 1/50; G03F 1/68; G03F 7/20
See application file for complete search history.

(56) References Cited

U.S. PATENT DOCUMENTS

| | | | |
|---|---|---|---|
| 6,498,105 B1 | 12/2002 | Kim | |
| 7,802,226 B2 | 9/2010 | Park | |
| 8,383,300 B2 | 2/2013 | Kim | |
| 8,632,930 B2 | 1/2014 | Hsu | |
| 8,644,589 B2 | 2/2014 | Hsu | |
| 8,910,091 B2 | 12/2014 | Chen | |
| 2012/0295187 A1* | 11/2012 | Tsai | G06F 17/5072 430/5 |
| 2013/0094035 A1* | 4/2013 | Chang | G03F 1/68 358/1.9 |

\* cited by examiner

*Primary Examiner* — Nha Nguyen
(74) *Attorney, Agent, or Firm* — Winston Hsu; Scott Margo (57) ABSTRACT

A method for decomposing a layout of an integrated circuit is provided. First, a layout of the integrated circuit is imported, wherein the layout comprises a plurality of sub patterns in a cell region, and a first direction and a second direction are defined thereon. Next, one sub pattern positioned at a corner of the cell region is assigned to an anchor pattern. Then, the sub patterns in the row same as the anchor pattern along the second direction is assigned to the first group. Finally, the rest of the sub patterns are decomposed into the first group and the second group according to a design rule, wherein the sub patterns in the same line are decomposed into the first group and the second group alternatively.

12 Claims, 11 Drawing Sheets

METHOD FOR DECOMPOSING A LAYOUT OF AN INTEGRATED CIRCUIT

BACKGROUND OF THE INVENTION

1. Field of the Invention

The present invention is related to a method for decomposing a layout of an integrated circuit, and more particularly, to a method for decomposing a layout of an integrated circuit by using double exposure technology.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

In recent years, with the increasing miniaturization of semiconductor devices, the design rule of line width and space between lines or devices becomes finer. However, the width is subject to optical characteristics. To obtain fine-sized devices in the exposure, the interval between transparent regions in a mask is scaled down with device size. When the light passes through the mask, diffraction occurs and reduces resolution. Moreover, when light passes through the transparent regions of a mask having different interval sizes, the light through the regions having small interval sizes is influenced by the transparent regions having large interval sizes and results in deformation of the transfer pattern.

A double-exposure technique has been developed in recent years. The double-exposure technique involves decomposing a target pattern into two separated patterns, which are then transferred to a photoresist layer respectively by two exposure processes. Since the pitch of the decomposed pattern is larger, the pattern can be formed by current exposure systems. However, there are still some problems needed to be overcome in the double-exposure technique.

SUMMARY OF THE INVENTION

The present invention therefore provides a method related to double exposure technology and is used to fabricate fine patterns.

According to one embodiment, a method for decomposing a layout of an integrated circuit is provided. First, a layout of the integrated circuit is imported, wherein the layout comprises a plurality of sub patterns in a cell region, and a first direction and a second direction are defined thereon. Next, one sub pattern positioned at a corner of the cell region is assigned to an anchor pattern. Then, the sub patterns in the row same as the anchor pattern along the second direction is assigned to the first group. Finally, the rest of the sub patterns are decomposed into the first group and the second group according to a design rule, wherein the sub patterns in the same line are decomposed into the first group and the second group alternatively.

The present invention provides a method for decomposing a layout of an integrated circuit, including using a double exposure technology. The layout of the integrated circuit is decomposed into at least two groups for respectively forming two photo-masks. By assigning an anchor pattern, only one uniform result of grouping is provided. Consequently, the formed photo-masks have uniform and regular pattern so the structures can be formed precisely by using the photo-mask.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

The present invention is related to a method of forming an integrated circuit. The layout of the integrated circuit includes fine patterns in a dense region, making it challenging to fabricate. Thus, the double exposure technology is utilized for forming such fine pattern. The double exposure technology includes decomposing the layout into two groups, namely a first group and a second group. The patterns in the first group or the patterns in the second group exhibit larger pitch and thus easy to fabricate. By using two-patterning-two-etching (2P2E) or two-patterning-one-etching process (2P1E), the patterns of the first group and the second group are formed, together constituting the original layout. Based on this technology, the present invention therefore provides a method including decomposing layout into two groups, with novel improvement in comparison to conventional arts.

Figure 1:
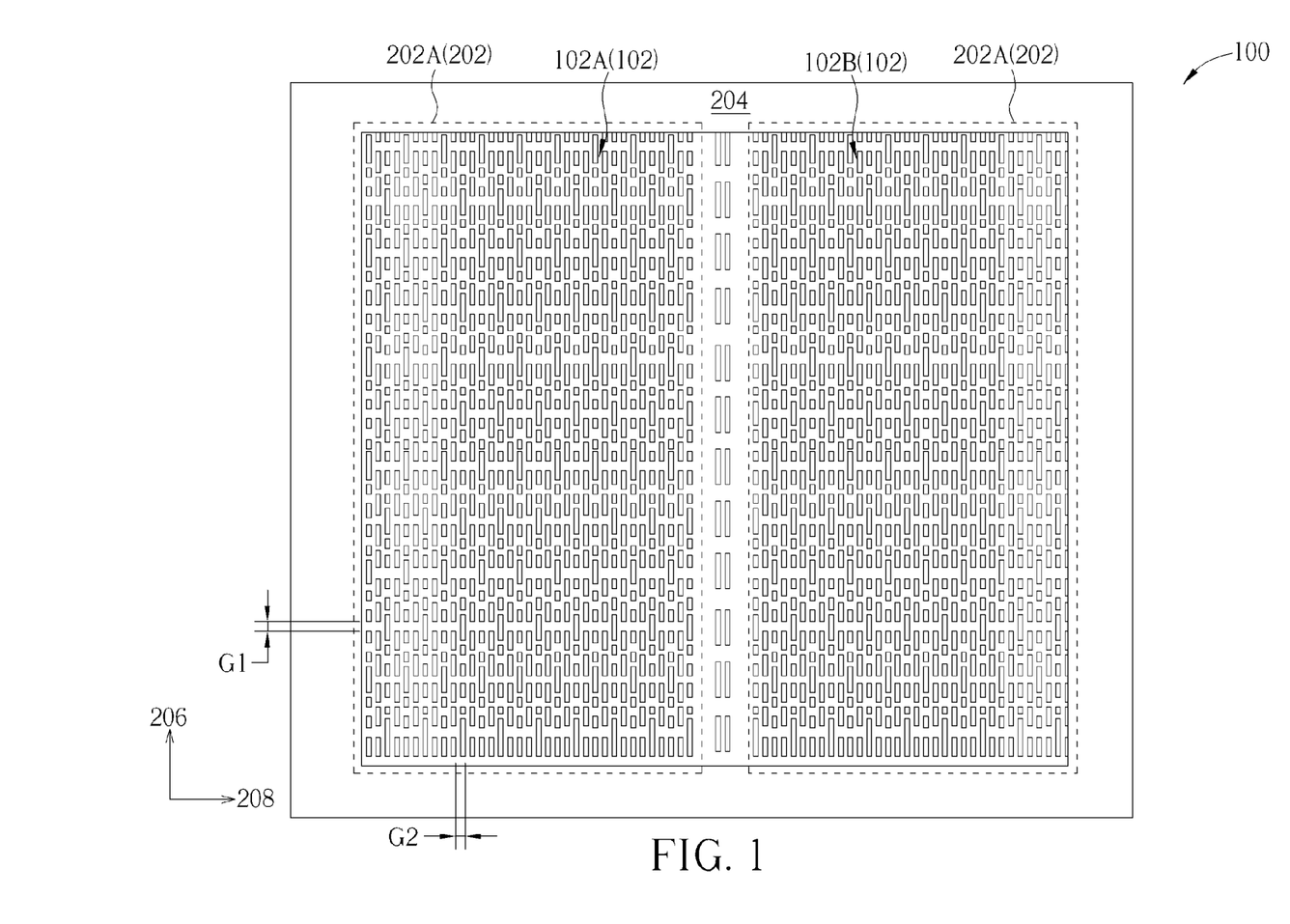
FIG. 1 and FIG. 2 show schematic diagrams of the method of decomposing a layout of an integrated circuit according to one embodiment of the present invention.
Figure 2:
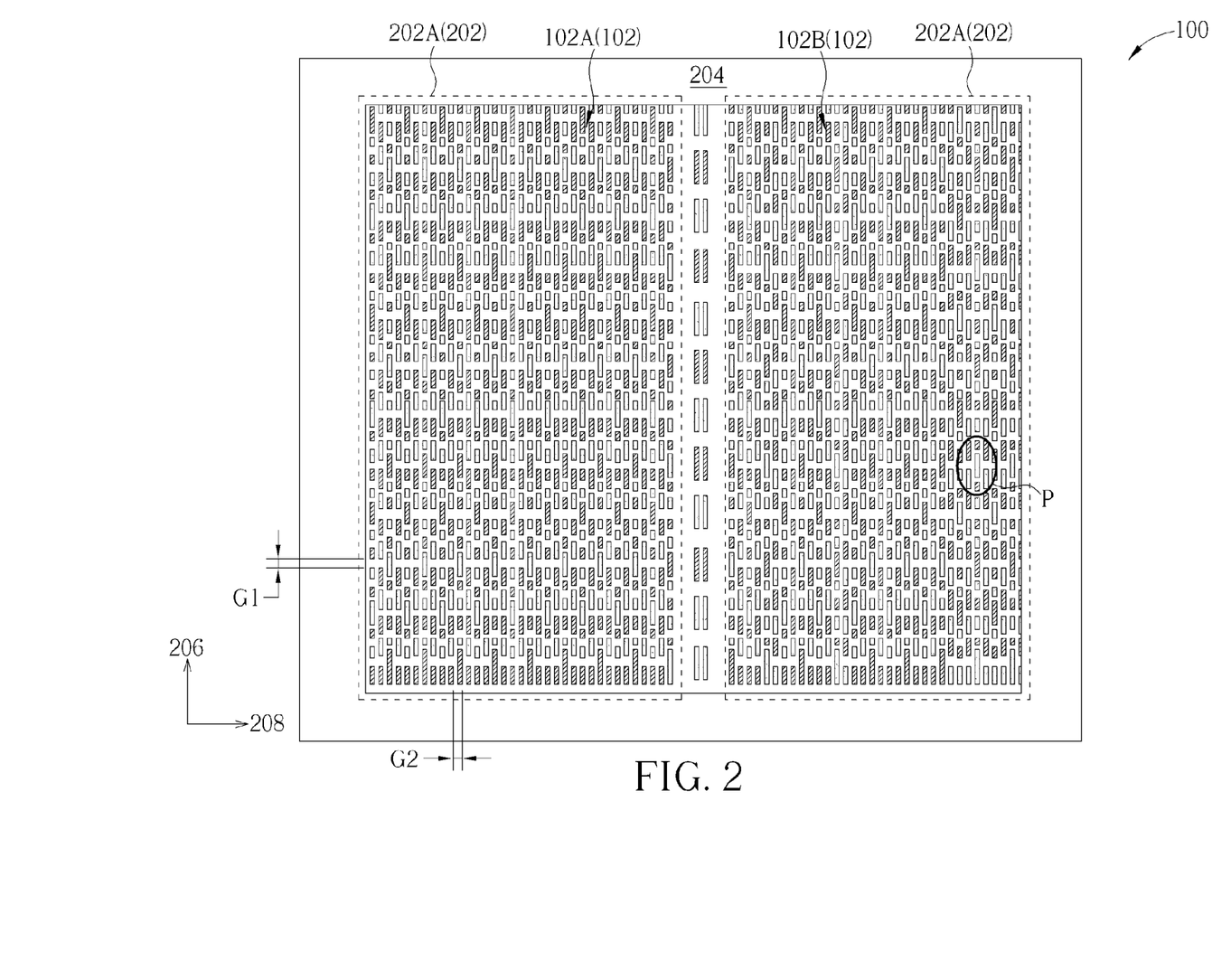

Please refer to FIG. 1 and FIG. 2, which show schematic diagrams of the method of decomposing a layout of an integrated circuit according to one embodiment of the present invention. As shown in FIG. 1, first, a layout 100 of an integrated circuit is imported to a computer. The layout 100 has a first direction 206 and a second direction 208 defined thereon. Preferably, the first direction 206 is perpendicular to the second direction 208. In one embodiment, the layout 100 may be in the form of GDSII or OASIS™ or some other format for describing various shapes, sizes, and relationships of elements of a semiconductor chip and can be imported into a database to be included with other information about the integrated circuit. The term "computer" in the present invention refers to any programmable apparatus that can execute any computer program instructions including multiple programs or threads. The multiple programs or threads may be processed approximately simultaneously to enhance utilization of the processor and to facilitate substantially simultaneous functions. As depicted in the FIG. 1, the layout 100 includes at least one cell pattern 102 located in a cell region 202, which is surrounded by an isolation region 204. In one embodiment, the cell region 202 is a dense region so the pattern density per unit area of the cell region 202 is much greater than that of the isolation region 204. In one embodiment, the layout 100 may include a plurality of cell patterns 102, each respectively disposed in different cell regions 202. For example, the cell pattern 102A is located within the cell region 202A and the cell pattern 102B is located within the cell region 202B. In one embodiment, the cell pattern 102A and the cell pattern 102B are identical, meaning that the arrangement and the contour of the cell pattern 102A are the same as those of the cell pattern 102B. In another embodiment, they may not be the same. Preferably, the cell pattern 102 contains a plurality of sub patterns 104, some of which positioned in the same line along the first direction 206 and some of which positioned in the same row along the second direction 208, thereby forming an array from top view. In one embodiment, the sub patterns 104 in the same row are arranged in a regular manner and a predetermined number of the sub pattern 104 forms a set which repeatedly appears in the same row. It is the same situation of the sub patterns 104 in the same line. In the present embodiment, the sub patterns 104 in the same line are compact and the sub patterns 104 in the same line are loose. That is, the gap G1 between each two sub patterns 104 in the same line is very small and can be below a critical dimension (CD) of a semiconductor manufacturing system used to form the layout 100. On the other hand, the gap G2 between each two sub patterns 104 in the same row is relatively large and can be greater than the CD. In one embodiment, the gaps G2 are of the same value.

As shown in FIG. 2, by using a computer, the cell pattern 102 of the layout 100 is decomposed into a first group and a second group according to a design rule. The design rule, for example, is related to the fabrication process and is used to check if the pattern can be formed precisely. In the present invention, the design rule specifically considers the decomposing steps to make sure both the first group and the second group of the cell pattern 102 meets the fabrication process. For example, the rule checks whether both the pitches in the first group and the second group are greater than CD. Generally, the checking step is executed by a computer. Although the result of the decomposition complies with the design rule, in some cases, the result is not unique. There might be a lot of decomposition results of one imported layout, but all the results comply with the design rule. It is easy to occur when the patterns are compact in one direction and loose in another direction, just like the patterns 100 in this embodiment. As shown in FIG. 2, though the pattern 102A in the cell region 202A and the pattern 102B in the cell region 202B are identical, the decomposing results are not. In the cell region 202B, the sub pattern 104 marked by arrow P belongs to the second group, while the others in the same row belong the first group. The uneven result would increase the difficulty for forming the photo-masks, and structures formed by using such photo-mask may not have good quality due to some disturbance such as light diffraction.

Figure 3:
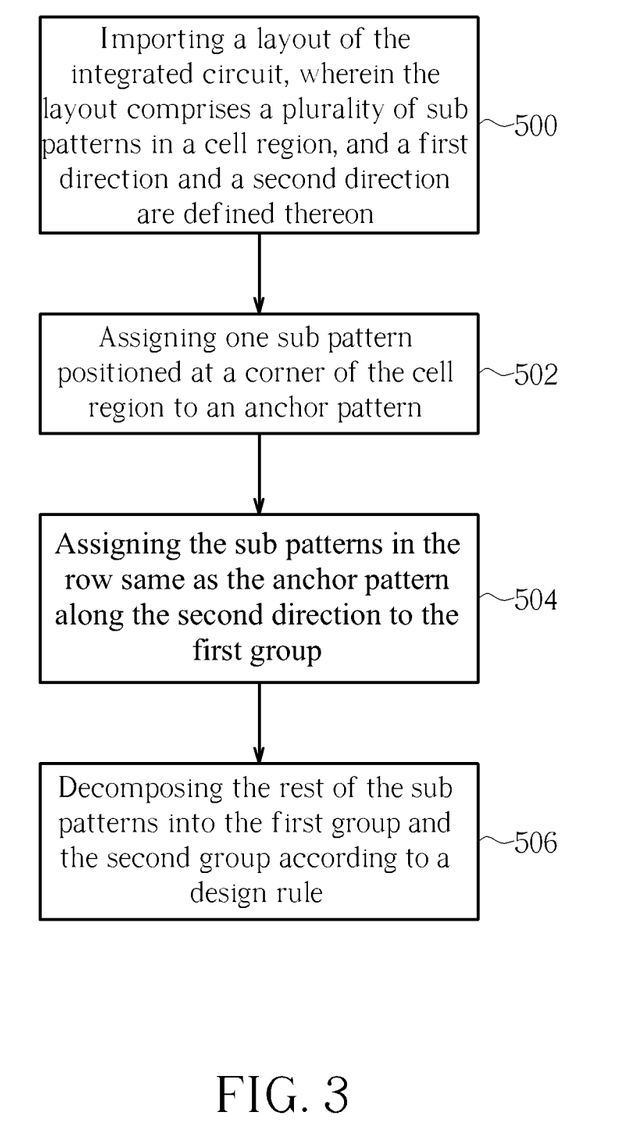
FIG. 3 to FIG. 6 show schematic diagrams of the method of decomposing a layout of an integrated circuit according to one embodiment of the present invention.
Figure 4:
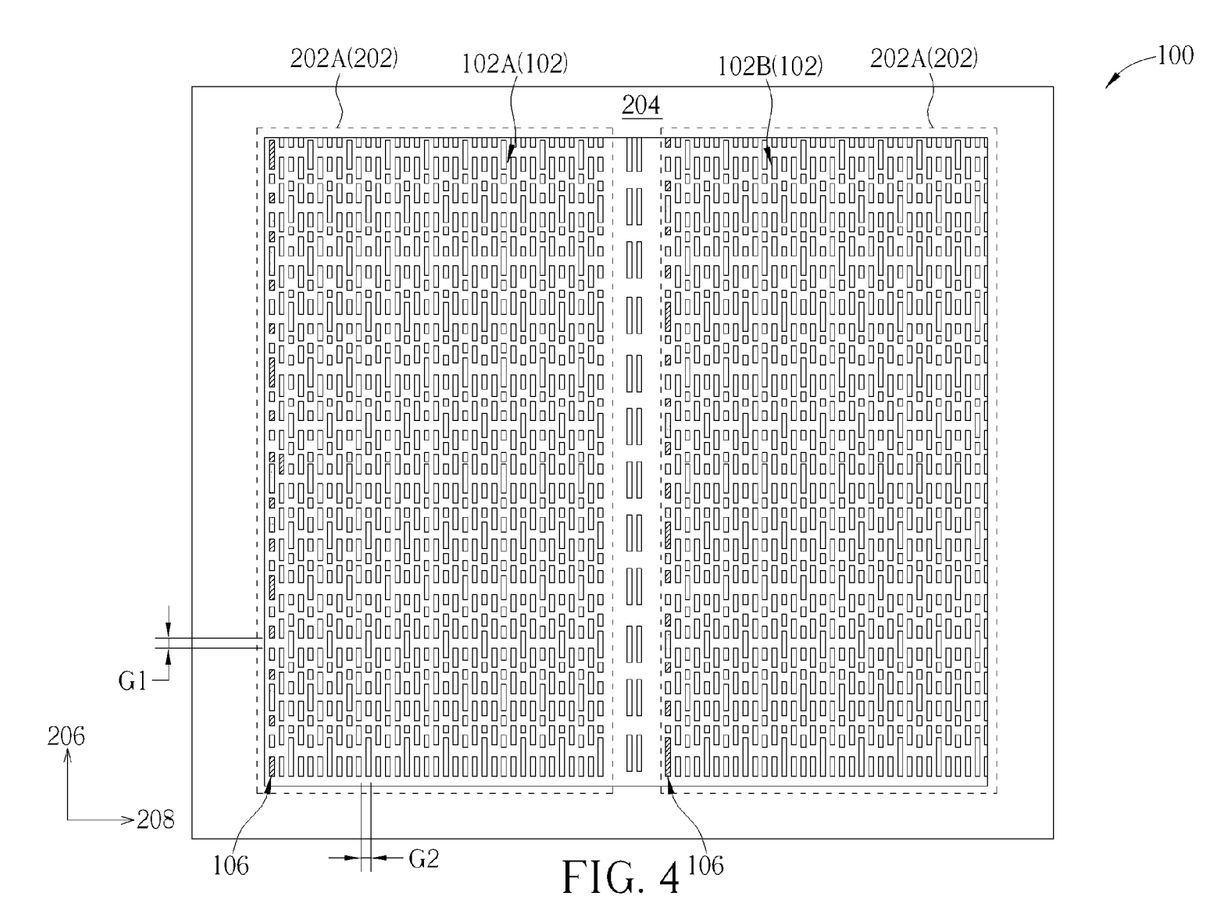
Figure 5:
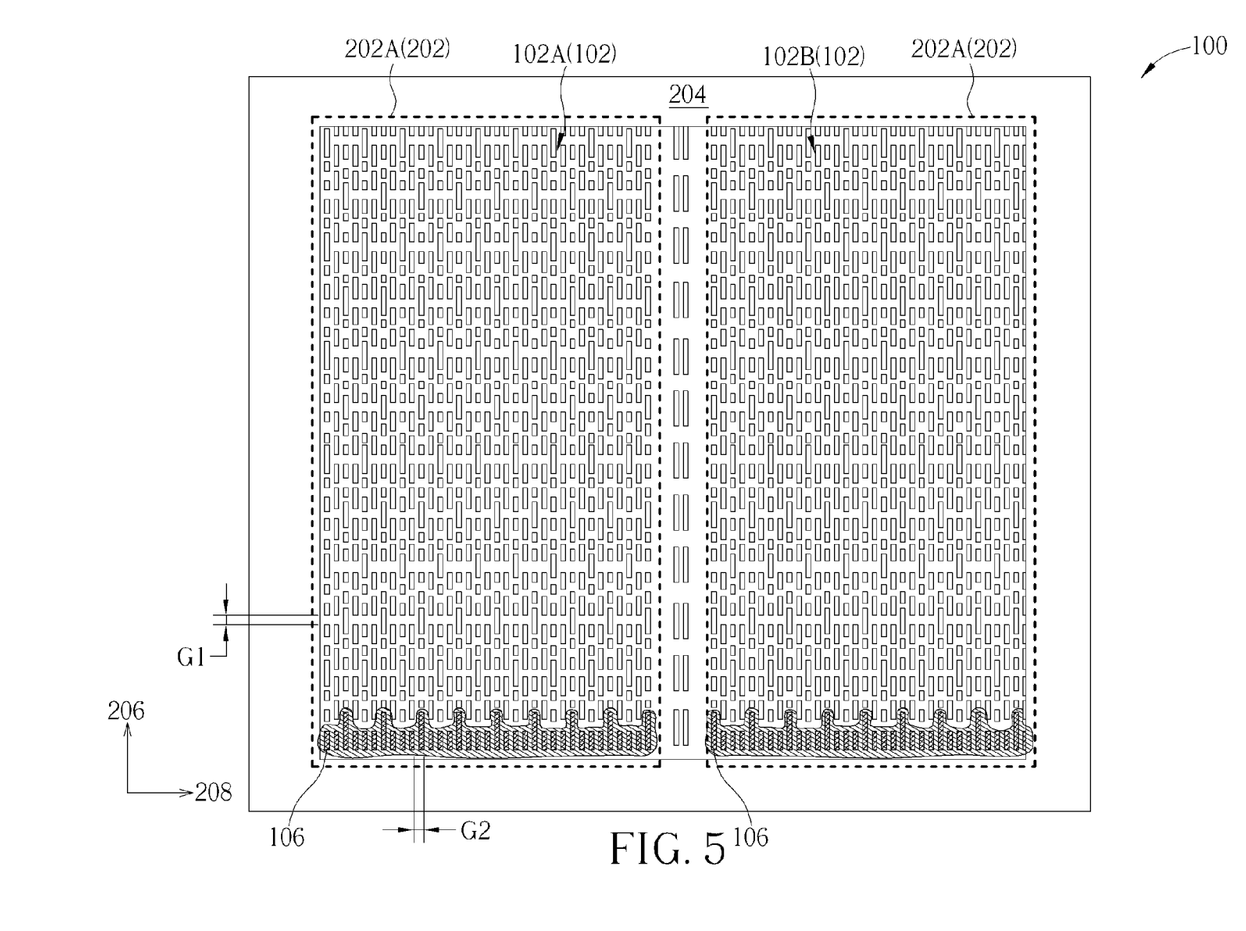
Figure 6:
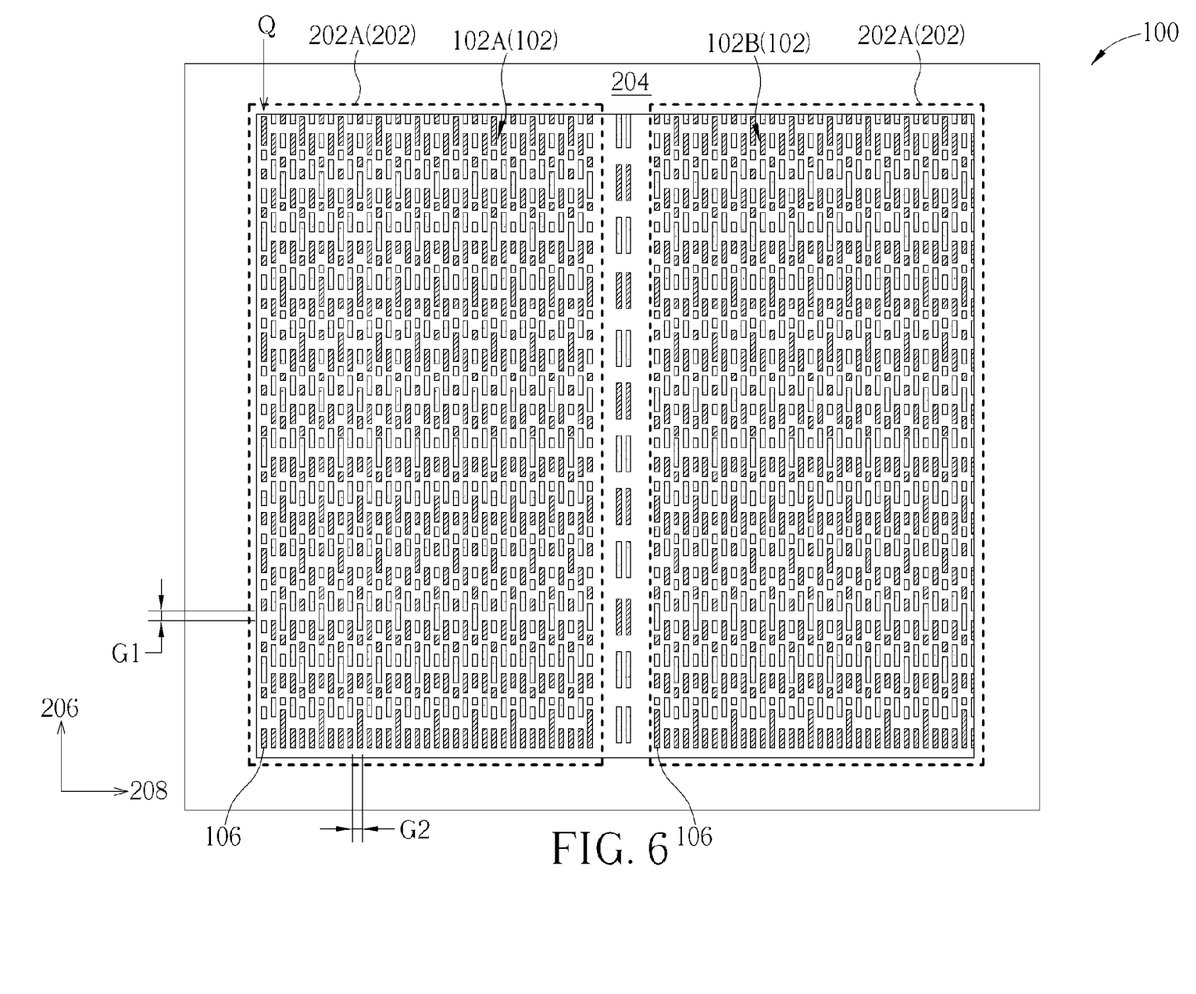

To improve the previous embodiment, the present invention further provides another method for decomposing the layout. Please refer to FIG. 3 and FIG. 4 to FIG. 6. FIG. 3 shows a flow chart and FIG. 4 to FIG. 6 show schematic diagrams of the method of decomposing a layout according to one embodiment of the present invention. First, a layout 100 of an integrated circuit is imported to a computer, wherein the layout 100 comprises a plurality of cell patterns 102 in a cell region 200, and a first direction 204 and a second direction 206 are defined thereon (step 500). The first step is similar to the previous embodiment shown in FIG. 1. Detail descriptions are therefore omitted.

Next, one of the sub patterns 104 is assigned as an anchor pattern 106 (step 502). With reference to FIG. 4, the anchor pattern 106 can be any sub pattern 104 within the cell region 202. Preferably, the anchor pattern 106 is positioned adjacent to an edge of the cell region 202. More preferably, the anchor pattern 106 is located at a corner of the cell region 202.

After assigning the anchor pattern 106, the sub patterns 104 in the row same as the anchor pattern 106 are assigned as a first group (step 504). With reference to FIG. 5, all the sub patterns 104 in the same row along the second direction 406 are assigned to a first group (marked by shadow). Since the gaps G2 between each two sub patterns 104 along the second direction 206 is beyond the CD, there is enough process window and assigning the sub patterns 104 in the same row as the same group is still within the tolerance of the manufacturing process.

Thereafter, the rest of the sub patterns 104 are decomposed into two groups, including the first group and the second group according to a design rule (step 506). With reference to FIG. 6, since one row of the sub patterns 106 has been assigned as the first group, there is only one solution after decomposing. For example, in the leftmost line in region 202A (pointed by arrow M), the gaps G1 between each two subs patterns 104 are smaller than CD, so the sub patterns 104 in line M should be decomposed alternatively into the first group and the second group. As the lowermost row of the sub patterns 104 has been already assigned as the first group, the resulting sequence (from bottom to top) in line M would be: the first group (at the corner), the second group, the first group, . . . etc. It is the same situation in other lines of the sub patterns 104. As a result, by using the anchor layer 106 provided in this embodiment, there is only one decomposition result. Consequently, a uniform patter split result can be provided.

Thereafter, the first group of the sub patterns 104 is output to form a first photo-mask (not shown), and the second group of the sub patterns 102 is output to form a second photo-mask (not shown). The layout 100 with cell pattern 102 that contains the sub patterns 104 can therefore be fabricated by using the first photo-mask and the second photo-mask through a double exposure technology.

Figure 7:
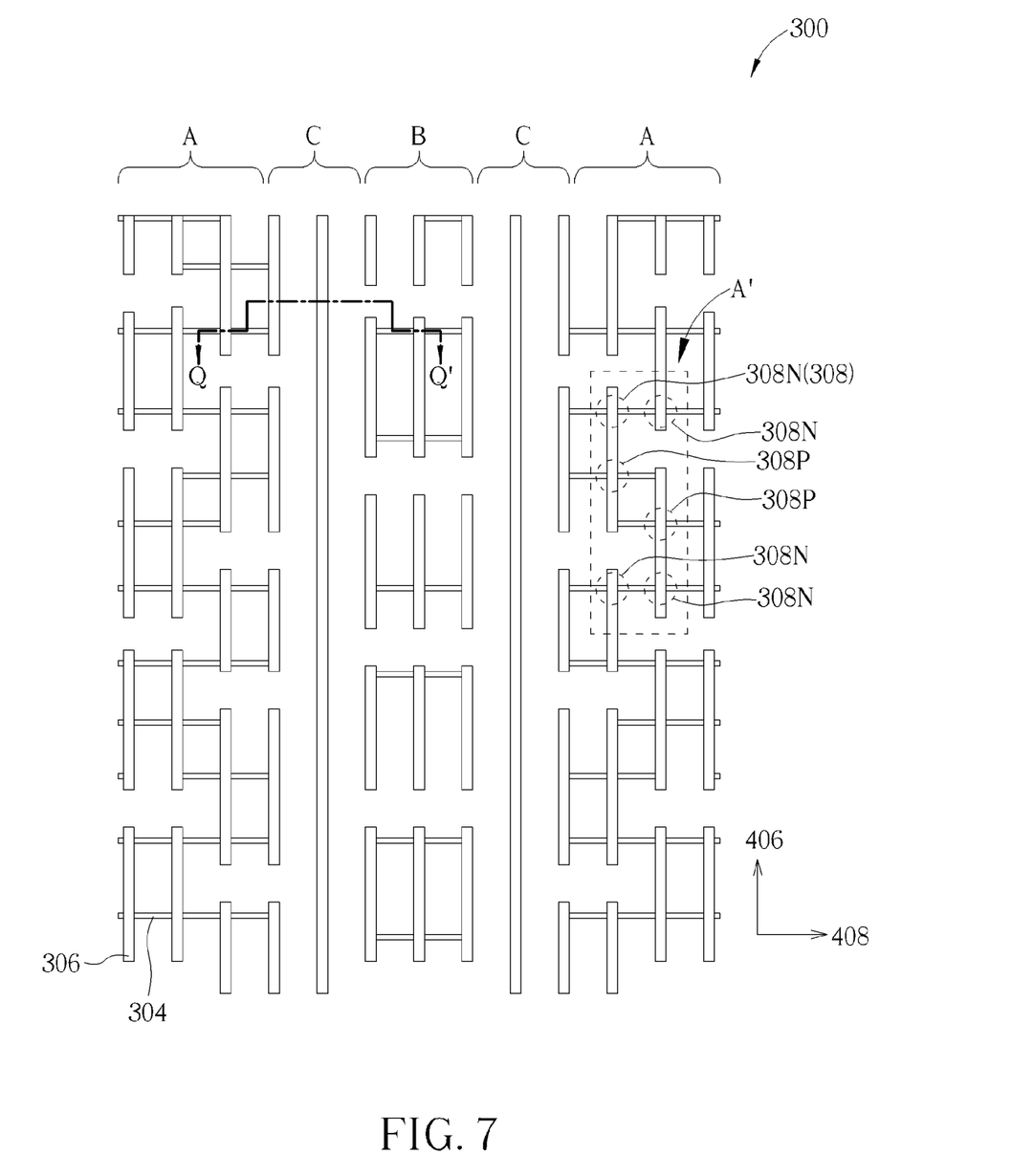
FIG. 7 to FIG. 11 show schematic diagrams of the method for fabricating an integrated circuit according to one embodiment of the present invention.
Figure 8:
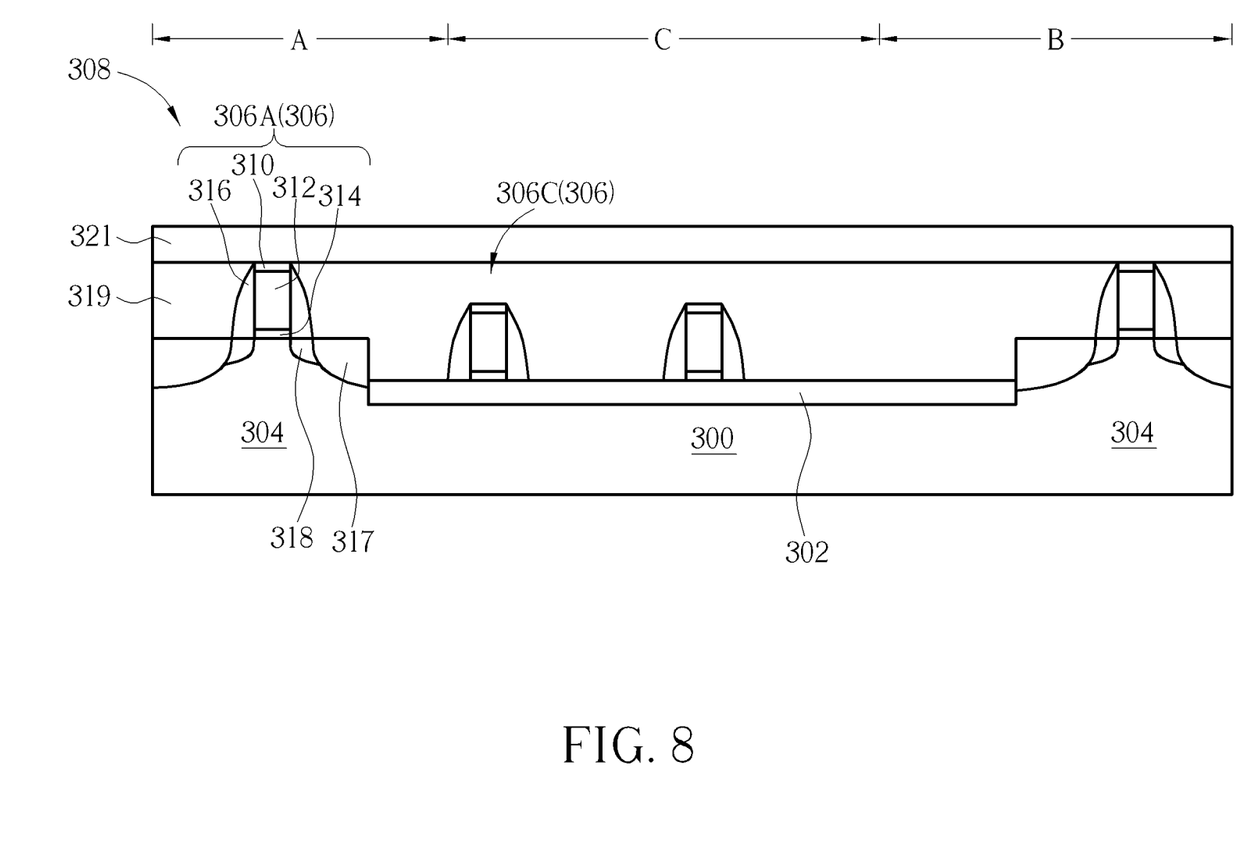

It is noted that the above mentioned method can be applied to any patterns of an integrated circuit. The following context will take slot contacts as an example. Please refer to FIG. 7 to FIG. 11, showing schematic diagrams of the method for fabricating an integrated circuit according to one embodiment of the present invention. Please first see FIG. 7 and FIG. 8, wherein FIG. 7 is a top view and FIG. 8 is a cross-sectional view taken along line QQ' of FIG. 7. A substrate 300 is provided to serve as a base for forming devices, components, or circuits. The substrate 300 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layered materials thereof. The semiconductor substrate 300 may also be composed of other semiconductor materials, such as germanium, and compound semiconductor substrates, such as type III/V semiconductor substrates, e.g., GaAs. Although the semiconductor substrate 300 is depicted as a bulk semiconductor substrate, the arrangement of a semiconductor on an insulator substrate, such as silicon-on-insulator (SOI) substrates, is also suitable for the semiconductor substrate 300. At least three regions including a plurality of regions A, a plurality of regions B and a plurality of regions C are defined on the substrate 300. In one embodiment, region A is a 8K memory cell region and a plurality of memory cells are disposed therein. Region B is a pick-up regions for providing grounding routes for the substrate 300. Region C is a dummy region. It is understood that both regions B and regions C have smaller pattern density and can be referred to as the isolated region 204 in FIG. 1, while regions A has larger pattern density and can be referred to as the cell region 202 in FIG. 1.

As depicted in FIG. 7 and FIG. 8, a plurality of fin structures 304, a plurality of shallow trench isolations (STI) 302 and a plurality of gate structures 306 are formed on the substrate 300. The fin structures 304 stretch along a second direction 408, being encompassed by the STIs 302 and protruding thereover. The method for forming the fin structure 304 includes, for example, forming a patterned hard mask layer (not shown) on the substrate 300, performing an etching process to form a plurality of trenches (not shown) in the substrate 300, filling an insulating material such as $SiO_2$ into the trenches, and performing a planarization and/or etching process to form said STIs 302. The protruding portion of the substrate 300 above STI 302 therefore becomes the fin structures 304. The gate structures 306 stretch along a first direction 406 and straddle over the fin structures 304 and the STIs 302. The second direction 406 is preferably perpendicular to the first direction 408. The intersecting fin structures 304 and the gate structures 306 constitute a plurality of transistors 308. In one embodiment, region A is a 6-transistor (6T) SRAM region and there are six transistors 308, two P-type transistors 308P and four N-type first transistors 308N to constitute one memory cell (please see region A').

For detail descriptions for the transistors 308, please see the cross-sectional view of FIG. 8. In region A, the transistor 308 is comprised of the gate structure 306, a spacer 316, a light doped drain (LDD) region 318 and a source/drain region 317. In one embodiment, the gate structure 306 comprises a capping layer 310, a conductive layer 312 and a gate dielectric layer 314. The capping layer 310 includes, for example, silicon nitride (SiN), silicon carbide (SiC) or silicon oxynitride (SiON). In one embodiment, the capping layer 310 may be one or multi layers composed of different dielectric materials. For example, the capping layer 310 may comprise a first capping layer (not shown) and a second capping layer (not shown), which is composed of $SiO_2$ and SiN, respectively. The conductive layer 312 can include metal or poly-silicon. The gate dielectric layer 314 includes $SiO_2$ or high-k dielectric materials, such as a material having dielectric constant greater than 4. The spacer 316 is disposed on at least a sidewall of the gate structure 306. The spacer 316 can be a single layer or a composite layer, which is composed of high temperature oxide (HTO), silicon nitride, silicon oxide or silicon nitride (HCD-SiN) formed by hexachlorodisilane ($Si_2Cl_6$). The LDD region 318 is disposed in the fin structure 304 and has a predetermined conductive type dopant. In P-type transistor 308P, the predetermined conductivity type dopant is P type dopant, such as boron (B) and/or boron fluoride (BF). Conversely, in N-type transistor 308N, the predetermined conductivity type dopant an N-type dopant such as arsenic (As) and/or phosphorus (P) and/or antimony (Sb), but are not limited thereto. The source/drain region 317 is disposed in the fin structure 304 (or the substrate 300) at at least one side of the gate structure 306 and has a dopant with the same conductive type with the LDD region 318. In one embodiment, the spacer 316 and the LDD region 318 are optional. In region B, the transistor may have similar components with those of the transistors in region A. In one embodiment, since region B is a pick-up region, the LDD region and/or the source/drain region in region B may have the same conductive type dopant with a well or dopant region in the substrate 300 in region B for allowing current to pass therethrough. In region C, which is a dummy region, the dummy gate structure 306C does not straddle over any fin structures 304 and are disposed only on the STI 302, so no LDD region or source/drain region are formed in region C. In addition, the space of region C can be adjusted based on different design so two or more than two dummy gate structures 306C may be disposed in region C. An inter-dielectric (ILD) 319 is formed on the substrate 300 for covering the transistors 308. The ILD 319 may include $SiO_2$, silicon dioxide formed by precursor tetraethyl orthosilicate (TEOS), plasma enhanced silicon dioxide formed by precursor etraethyl orthosilicate (PETEOS), but not limited thereto. Optionally, a metal gate replacement process can further be performed, including a chemical mechanism polish (CMP) process for removing the capping layer 310, removing the conductive layer 312 and/or the gate dielectric layer 314 for forming trenches (not shown), filling metal material and/or gate dielectric layer into the trench for forming a metal gate structure. In one embodiment, a cap layer 321 is formed on the ILD layer 319. The cap layer 321 can be made of different dielectric material from that of the ILD layer 319. Alternatively, they can be formed of the same material.

Figure 9:
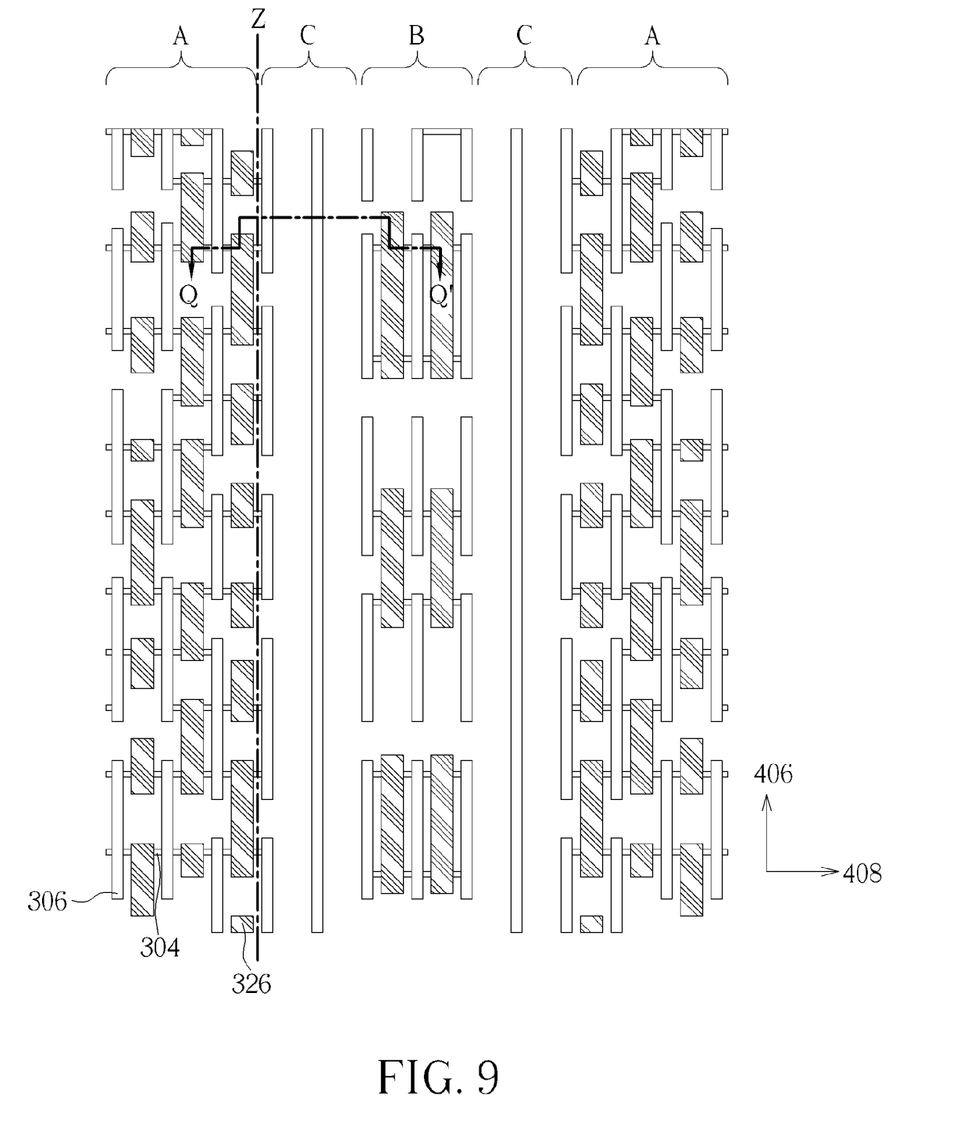
Figure 10:
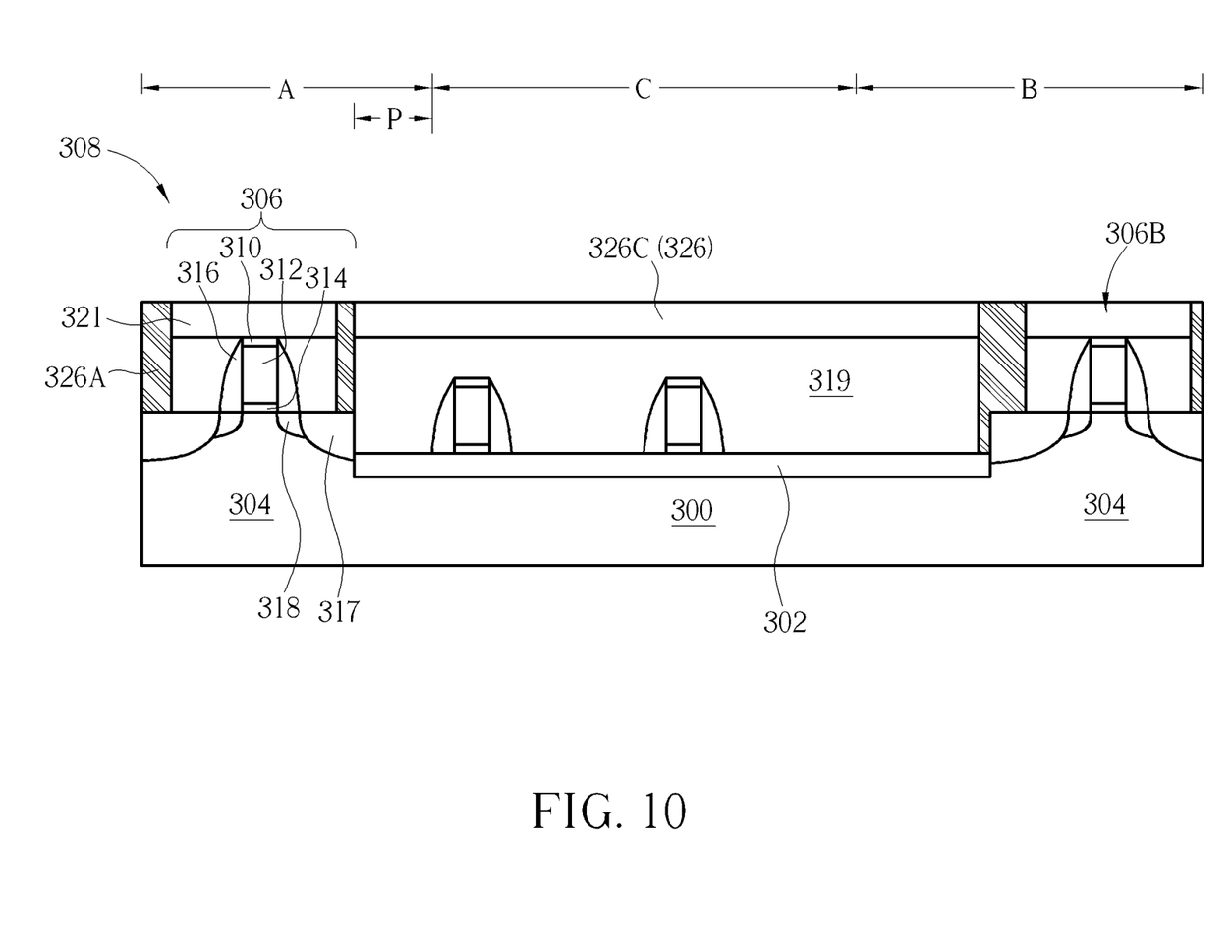

Next, as shown in FIG. 9 and FIG. 10, a plurality of slot contacts 326 are formed on the substrate 300. The slot contacts 326 stretch along the first direction 406 and are arranged with the gate structures 306 alternatively. In the present embodiment, the slot contacts 326 are arranged in array and fabricated by the double exposure technology. For example, the layout of the slot contacts 326 are first imported into a computer and decomposed into two groups. Prior to decomposition process, one slot contact pattern (not shown in FIG. 9, but can see FIG. 2 for reference) at a corner of the region A is assigned as an anchor pattern. Next, the slot contact patterns in the same row (along the second direction 408) are assigned as a first group. Thereafter, the rest of the slot contact patterns are decomposed into the first group and the second group respectively according to a design rule. The first group of the slot contact pattern is output to form a first photo-mask and the second group of the slot contact pattern is output to form a second photo-mask. The slot contacts 326 is formed, for example, by forming a dielectric layer (not shown) on the substrate 300, then performing a photo-etching-process (PEP) by using the first photo-mask to pattern the dielectric layer, and performing another PEP by using the second photo-mask to again pattern the dielectric layer, thereby forming trenches corresponding to the slot contact pattern. Next, a conductive material is filled into the trenches, followed by a planarization process. Consequently, the slot contacts 326 are formed.

Figure 11:
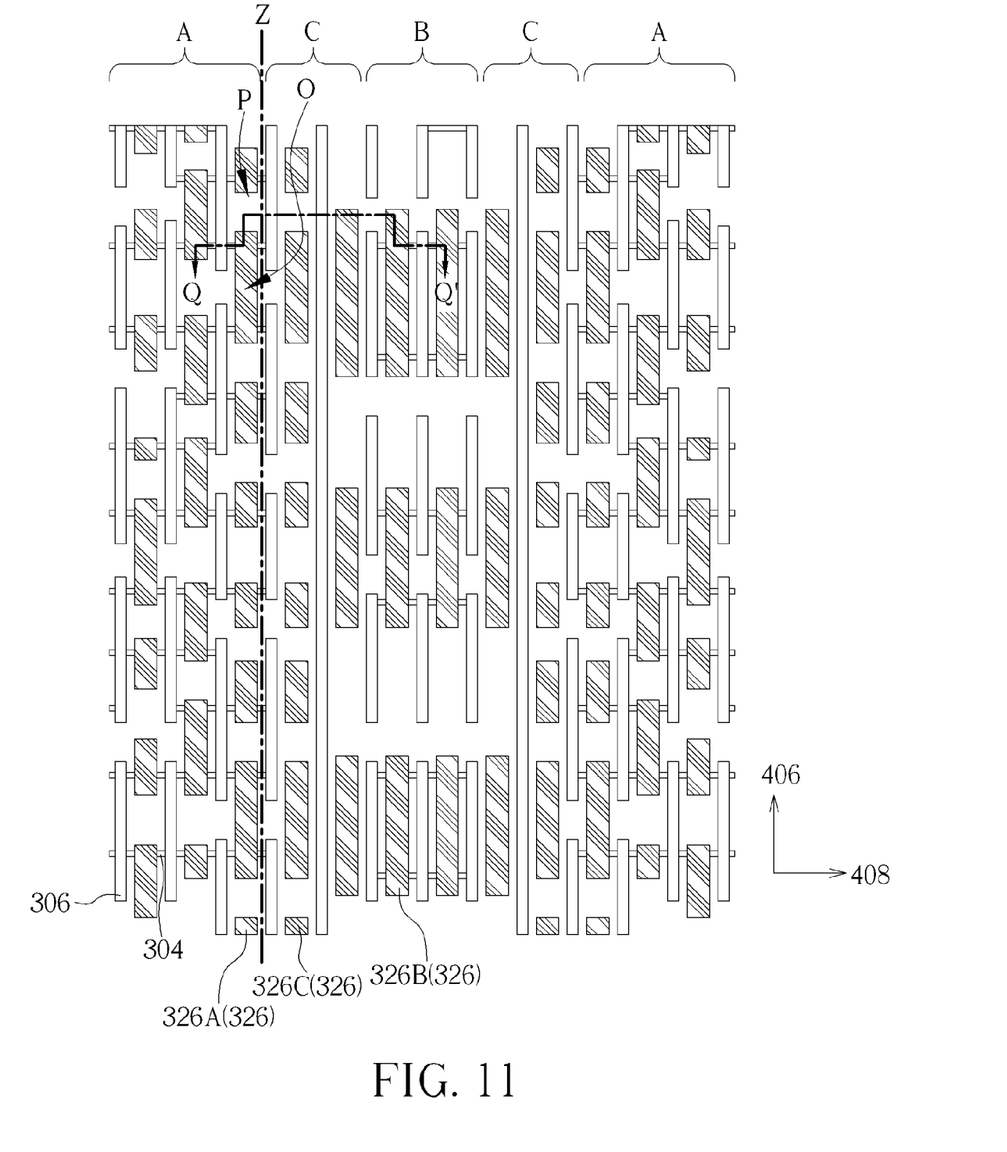

Please refer to FIG. 11, which shows one schematic diagram of the slot contact according to one embodiment of the present invention. To ensure the pattern density, some slot contacts 326 can be formed in the dummy region C, such as the slot contact 326C. In one preferred embodiment, each slot contact 326C next to the border between region A and region C corresponds to each slot contacts 326A, meaning that the projects of the slot contacts 326A completely match the projects of the slot contacts 326C along the second direction 408. In addition, each slot contact 326C next to the border between region C and region B corresponds to each slot contacts 326B. In one preferred embodiment, the slot contact 326C has a length (along first direction 406) substantially between 100 and 300 angstroms, preferably 200 angstroms, and has a width (along the second direction 408) substantially between 30 and 70 angstroms, preferably 50 angstroms. In this embodiment, since there are slot contacts 326 in region C, all the regions A, regions B and regions C together become a dense region. Thus, the slot contact pattern, including patterns in regions A, regions B and regions C, are decomposed based on the method shown above.

In light of above, the present invention provides a method for decomposing a layout of an integrated circuit, including using a double exposure technology. The layout of the integrated circuit is decomposed into at least two groups for respectively forming two photo-masks. The anchor layer can be any sub pattern in the cell region, whether the one at the corner, or in the middle row, and the sub patterns in the same row are assigned as the same group. Thus, the rest of the sub patterns in the same line can be decomposed, for example, alternatively into two groups from the assigned row of the anchor pattern. By assigning an anchor pattern, only one uniform result of grouping is provided. Consequently, the formed photo-masks have uniform and regular pattern so the structures can be formed precisely by using the photo-mask.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for decomposing a layout of an integrated circuit, comprising:
    importing the layout of the integrated circuit by using a computer, wherein the layout comprises a plurality of sub patterns in a cell region, and a first direction and a second direction are defined thereon;
    assigning one sub pattern positioned at a corner of the cell region to an anchor pattern;
    assigning all of the sub patterns in the row same as the anchor pattern along the second direction to a first group;
    decomposing the rest of the sub patterns into the first group and a second group according to a design rule, wherein the sub patterns in the same line are decomposed into the first group and the second group alternatively;
    adding a plurality of dummy patterns in the cell region before the decomposing step;
    adjusting a length of the dummy patterns along the first direction, wherein after the adjusting step, the length of the dummy pattern is substantially the same as that of the adjacent sub pattern;
    forming a first photo-mask with the sub patterns of the first group; and
    forming a second photo-mask with the sub patterns of the second group.

2. The method for decomposing a layout of an integrated circuit according to claim 1, wherein a plurality of first gaps between each two of the sub patterns along the first direction are under a CD of a exposure system in forming the integrated circuit.

3. The method for decomposing a layout of an integrated circuit according to claim 1, wherein a plurality of second gaps between each two of the sub patterns along the second direction are above a CD of a exposure system in forming the integrated circuit.

4. The method for decomposing a layout of an integrated circuit according to claim 3, wherein the second gaps are of the same value.

5. The method for decomposing a layout of an integrated circuit according to claim 1, wherein the cell region is a dense region.

6. The method for decomposing a layout of an integrated circuit according to claim 5, wherein the cell region is encompassed by an isolated region.

7. The method for decomposing a layout of an integrated circuit according to claim 1, wherein a plurality of cell regions are defined in the layout and an arrangement of the sub patterns in each cell region is identical.

8. The method for decomposing a layout of an integrated circuit according to claim 1, wherein the cell region is an SRAM region.

9. The method for decomposing a layout of an integrated circuit according to claim 1, wherein the first photo-mask and the second photo-mask are used to form the integrated circuit in a semiconductor fabricating process.

10. The method for decomposing a layout of an integrated circuit according to claim 1, wherein the first direction is substantially perpendicular to the second direction.

11. The method for decomposing a layout of an integrated circuit according to claim 1, wherein the integrated circuits are slot contacts.

12. The method for decomposing a layout of an integrated circuit according to claim 1, wherein the dummy patterns are dummy slot contacts.

\* \* \* \* \*